US010884152B2

(12) United States Patent
Min et al.

(10) Patent No.: US 10,884,152 B2
(45) Date of Patent: Jan. 5, 2021

(54) GRIP SENSING METHOD AND APPARATUS

(71) Applicant: ABOV Semiconductor co., Ltd., Cheongju-si (KR)

(72) Inventors: Dong Sik Min, Yongin-si (KR); Jung Hee Han, Yongin-si (KR); Chang Kyun Lee, Incheon (KR); Jeong Hwan Seo, Anyang-si (KR); Seok Hyun Jee, Namyangju-si (KR)

(73) Assignee: ABOV Semiconductor co., Ltd., Cheongju-si (KR)

( * ) Notice: Subject to any disclaimer, the term of this patent is extended or adjusted under 35 U.S.C. 154(b) by 73 days.

(21) Appl. No.: 16/447,984

(22) Filed: Jun. 21, 2019

(65) Prior Publication Data

US 2020/0363553 A1 Nov. 19, 2020

(30) Foreign Application Priority Data

May 14, 2019 (KR) .................. 10-2019-0056251

(51) Int. Cl.
  *G01V 3/08* (2006.01)
  *G01D 5/24* (2006.01)
  (Continued)

(52) U.S. Cl.
  CPC .............. *G01V 3/08* (2013.01); *G01D 5/24* (2013.01); *G01R 27/2605* (2013.01);
  (Continued)

(58) Field of Classification Search
  CPC . G01V 3/00; G01V 3/08; G01R 27/00; G01R 27/02; G01R 27/26; G01R 27/2605;
  (Continued)

(56) References Cited

U.S. PATENT DOCUMENTS 8,449,410 B1 * 5/2013 Kaufman .............. A63B 60/46
  473/549
2010/0267502 A1 * 10/2010 Kaufman .............. A63B 49/08
  473/549

(Continued)

FOREIGN PATENT DOCUMENTS

JP 2019-067123 A 4/2019
KR 10-2017-0068754 A 6/2017

*Primary Examiner* — Hoai-An D. Nguyen
(74) *Attorney, Agent, or Firm* — Park, Kim & Suh, LLC

(57) ABSTRACT

Disclosed herein are grip sensing method and apparatus. The grip sensing method includes generating a sensing count by differentially amplifying a voltage potential of a grip channel based on a predetermined correction offset and performing digital conversion, comparing the sensing count with a predetermined base value to determine whether a touch condition is satisfied, performing baseline tracking for determining a baseline count based on the sensing count when the sensing count is less than the base value and the touch condition is not satisfied, stopping the baseline tracking and performing temperature compensation with respect to the baseline count using a temperature sensor mounted therein when the sensing count is equal to or greater than the base value and the touch condition is satisfied, and sensing an event based on the sensing count and the temperature-compensated baseline count.

20 Claims, 13 Drawing Sheets

(51) Int. Cl.
 *G01R 27/26* (2006.01)
 *G06F 3/041* (2006.01)
 *G06F 3/044* (2006.01)
 *G06F 3/047* (2006.01)

(52) U.S. Cl.
 CPC .............. *G06F 3/041* (2013.01); *G06F 3/044* (2013.01); *G06F 3/047* (2013.01)

(58) Field of Classification Search
 CPC .. G01D 5/00; G01D 5/12; G01D 5/14; G01D 5/24; G01D 5/2405; G06F 3/00; G06F 3/01; G06F 3/03; G06F 3/041; G06F 3/0414; G06F 3/0416; G06F 3/044; G06F 3/0441; G06F 3/0442; G06F 3/0447
 USPC ....... 324/600, 649, 658, 663, 672, 684, 685, 324/686, 500, 537, 750.01, 750.03; 345/156, 173, 174
 See application file for complete search history.

(56) References Cited

U.S. PATENT DOCUMENTS

| | | | | |
|---|---|---|---|---|
| 2014/0371945 | A1* | 12/2014 | Sato | G11C 11/40611 700/299 |
| 2015/0123984 | A1* | 5/2015 | Kim | G01N 19/10 345/589 |
| 2016/0112526 | A1* | 4/2016 | Jeong | H04L 67/26 709/204 |
| 2019/0102008 | A1* | 4/2019 | Takada | G06F 3/0447 |
| 2019/0240449 | A1* | 8/2019 | Nishizawa | A61J 15/0084 |
| 2020/0117308 | A1* | 4/2020 | Heo | G06K 9/00013 |

\* cited by examiner

GRIP SENSING METHOD AND APPARATUS

This application claims the benefit of Korean Patent Application No. 10-2019-0056251, filed on May 14, 2019, which is hereby incorporated by reference as if fully set forth herein.

BACKGROUND OF THE INVENTION

Field of the Invention

The present invention relates to a grip sensing method and apparatus and, more particularly, to a method of more accurately performing grip sensing in a grip sensing apparatus provided with a grip sensing chip having a temperature sensor mounted therein and apparatuses therefor.

Discussion of the Related Art

With development of information and communication technologies, network apparatuses such as base stations are deployed throughout the country and electronic apparatuses transmit and receive data to other electronic apparatuses through networks, thereby allowing users to freely use the networks anywhere in the country.

Recently, various types of electronic apparatuses have been provided with various functions in sync with digital convergence. For example, smartphones support an Internet access function using the network, a music or video playback function, and a photographing or filming function using an image sensor, in addition to a function for making a call.

Users have begun to carry electronic apparatuses having various functions. Therefore, in order to manage harmful electromagnetic waves which may be generated in the electronic apparatuses, proximity sensors (grip sensor, proximity, SAR sensing) have been further used.

However, conventionally, a sensing value may be changed according to a temperature and grip sensing may be incorrectly performed in a long grip sensing period, thereby causing malfunction.

Accordingly, in order to solve the above-described problem, the grip sensing apparatus requires an appropriate temperature compensation method.

SUMMARY OF THE INVENTION

Accordingly, the present invention is directed to a grip sensing method and apparatus that substantially obviate one or more problems due to limitations and disadvantages of the related art.

An object of the present invention is to provide a grip sensing method capable of more accurately performing temperature compensation using a grip sensing chip having a temperature sensor mounted therein, and an apparatus therefor.

Another object of the present invention is to provide a grip sensing method capable of more accurately detecting a grip event without a reference sensing element located outside a grip sensing chip for temperature compensation, and an apparatus therefor.

Another object of the present invention is to provide a grip sensing method capable of performing nonlinear temperature compensation in consideration of a nonlinear capacitance change of a grip sensing channel including a plurality of passive elements according to a temperature change, and an apparatus therefor.

Another object of the present invention is to provide a grip sensing apparatus having a simple internal circuit structure and low cost.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the present invention provides a grip sensing method and apparatus.

A grip sensing method according to an embodiment includes generating a sensing count by differentially amplifying a voltage potential of a grip channel based on a predetermined correction offset and performing digital conversion, comparing the sensing count with a predetermined base value to determine whether a touch condition is satisfied, performing baseline tracking for determining a baseline count based on the sensing count when the sensing count is less than the base value and the touch condition is not satisfied, stopping the baseline tracking and performing temperature compensation with respect to the baseline count using a temperature sensor mounted therein when the sensing count is equal to or greater than the base value and the touch condition is satisfied, and sensing an event based on the sensing count and the temperature-compensated baseline count.

The sensing of the event may include subtracting the temperature-compensated baseline count from the sensing count, comparing the subtracted value with a second base count value, determining that the event occurs when the subtracted value exceeds the second base count value as a result of comparison, and determining that the event does not occur when the subtracted value is equal to or less than the second base count value as the result of comparison.

The performing of temperature compensation may include measuring a change amount of the sensing count during a first time, measuring a temperature change amount during the first time when the change amount of the sensing count exceeds a first value, and updating the baseline count when the measured temperature change amount exceeds a second value.

The updating of the baseline count may further include determining a slope corresponding to the measured temperature change amount.

The updating of the baseline count may include determining a temperature coefficient TEMP.COEF corresponding to a temperature change range by referring to a prestored look-up table, and updating the baseline count based on the determined temperature coefficient and the determined slope.

The baseline count may be updated by multiplying the baseline count by a unit temperature change ΔTEMP_STEP and the determined temperature coefficient when the calculated slope has a positive value, and the baseline count may be updated by multiplying the baseline count by the unit temperature change and then dividing the multiplied value by the determined temperature coefficient when the calculated slope has a negative value.

The temperature coefficient may be nonlinear according to the temperature change.

The updating of the baseline count may include determining a base offset BASE_OFFSET corresponding to a temperature change range by referring to the prestored look-up table, and updating the baseline count based on the determined base offset and the determined slope. The base offset may be nonlinear according to the temperature change.

The baseline count may be updated by adding, to the baseline count, the value obtained by multiplying the unit temperature change ΔTEMP_STEP by the determined base offset when the determined slope has a positive value, and the baseline count may be updated by subtracting, from the baseline count, the value obtained by multiplying the unit temperature change ΔTEMP_STEP by the determined base offset when the determined slope has a negative value.

The baseline count may not be updated and temperature compensation may be performed such that the temperature-compensated baseline count is equal to or greater than a lower-limit base value MINUS_LIMIT, when the measured temperature change amount is equal to or less than a second value.

The updating of the baseline count may include increasing the baseline count by a third value when the determined slope has a positive value and decreasing the baseline count by the third value when the determined slope has a negative value.

The event may be any one of a grip detect event and a grip release event.

A grip sensing apparatus according to another embodiment includes an amplifier configured to differentially amplify a voltage potential of a grip channel based on a predetermined correction offset, an analog-to-digital converter configured to perform digital conversion with respect to output of the amplifier to generate a sensing count, a comparator configured to compare the sensing count with a predetermined base value, a baseline tracking unit configured to determine a baseline count based on the sensing count when the sensing count is less than the base value as a result of comparison by the comparator, a temperature compensator configured to stop the baseline tracking and perform temperature compensation with respect to the baseline count using a temperature sensor mounted therein, when the sensing count is equal to or greater than the base value as a result of comparison by the comparator, and a sensing unit configured to sense an event based on the sensing count and the temperature-compensated baseline count.

The sensing unit may include a unit configured to subtract the temperature-compensated baseline count from the sensing count, a unit configured to compare the subtracted value with a second base count value, a unit configured to determine a grip state when the subtracted value exceeds the second base count value as a result of comparison, and a unit configured to determine that the grip state is released when the subtracted value is equal to or less than the second base count value as the result of comparison.

The temperature compensator may include a unit configured to measure a change amount of the sensing count during a first time, a unit configured to measure a temperature change amount during the first time when the change amount of the sensing count exceeds a first value CONT_T, and a unit configured to update the baseline count when the measured temperature change amount exceeds a second value TEMP_T.

The temperature compensator may further include a unit configured to determine a slope corresponding to the measured temperature change amount.

The temperature compensator may determine a temperature coefficient TEMP.COEF corresponding to a temperature change range by referring to a prestored look-up table, and updates the baseline count BASE_DATA based on the determined temperature coefficient and the determined slope, the temperature coefficient being nonlinear according to the temperature change, update the baseline count by multiplying the baseline count by a unit temperature change ΔTEMP_STEP and the determined temperature coefficient, when the calculated slope has a positive value, and update the baseline count by multiplying the baseline count by the unit temperature change ΔTEMP_STEP and then dividing the multiplied value by the determined temperature coefficient, when the calculated slope has a negative value.

The temperature compensator may determine a base offset BASE_OFFSET corresponding to a temperature change range by referring to the prestored look-up table and updates the baseline count based on the determined base offset and the determined slope, update the baseline count by adding, to the baseline count, the value obtained by multiplying the unit temperature change ΔTEMP_STEP by the determined base offset, when the determined slope has a positive value, and update the baseline count by subtracting, from the baseline count, the value obtained by multiplying the unit temperature change ΔTEMP_STEP by the determined base offset, when the determined slope has a negative value.

The temperature compensator may increase the baseline count by a third value when the determined slope has a positive value and decrease the baseline count by the third value when the determined slope has a negative value.

The third value may be set to a fixed value regardless of a temperature change range.

The event may be any one of a grip detect event and a grip release event, and the temperature compensator may perform temperature compensation such that the temperature-compensated baseline count is equal to or greater than a lower-limit base value MINUS_LIMIT.

Another embodiment of the present invention may further provide a computer-readable program for performing any one of grip sensing methods and a recording medium having the program recorded thereon.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
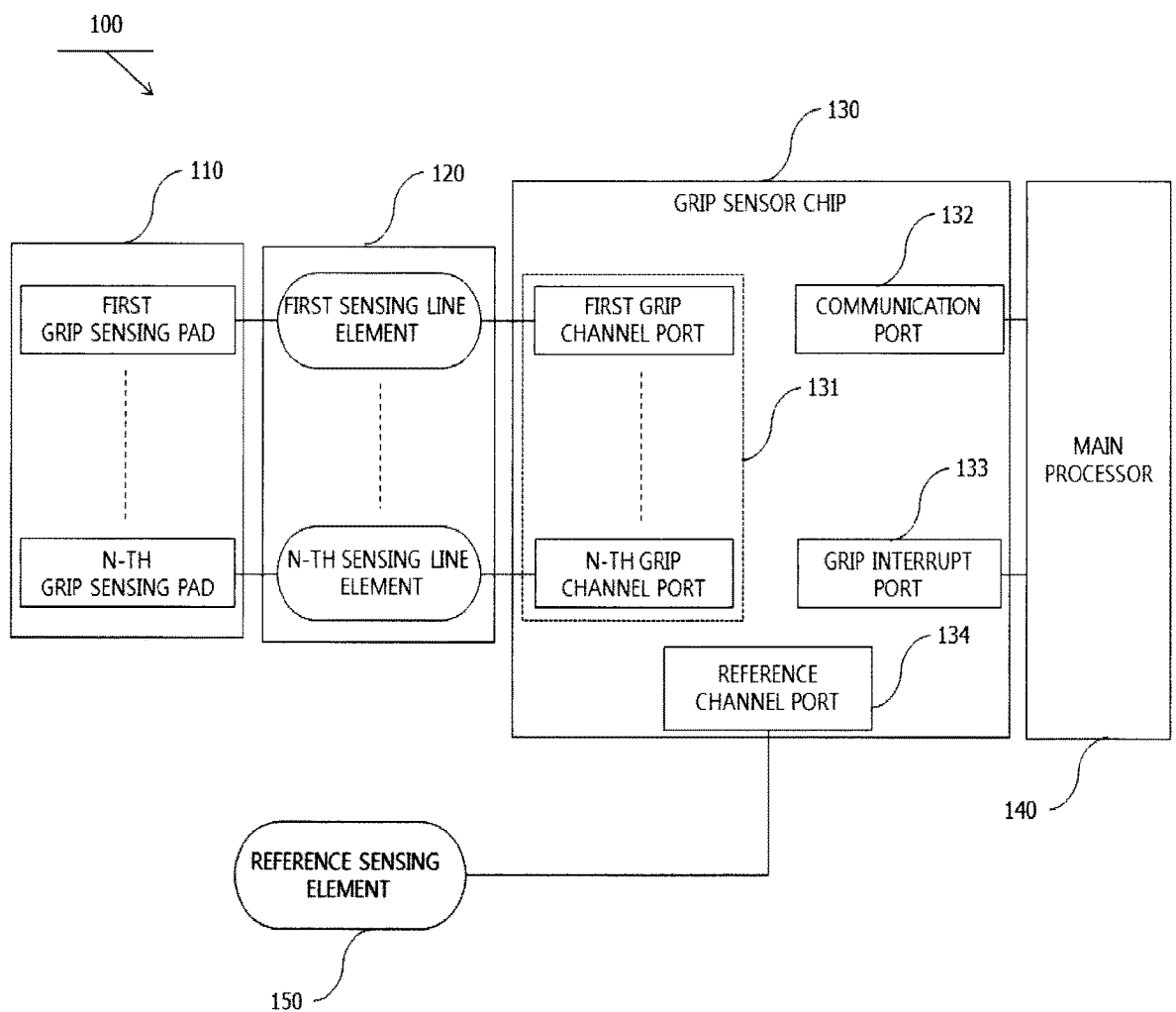
FIG. 1 is a diagram illustrating a conventional temperature compensation method of a grip sensor using an external pin.

Hereinafter, apparatuses and various methods according to embodiments will be described in detail with reference to the accompanying drawings. In general, a suffix such as "module" or "unit" may be used to refer to elements or components. Use of such a suffix herein is merely intended to facilitate description of the specification, and the suffix itself is not intended to have any special meaning or function.

Although all elements constituting the embodiments of the present invention are described as being integrated into a single one or to be operated as a single one, the present invention is not necessarily limited to such embodiments. According to embodiments, all of the elements may be selectively integrated into one or more and be operated as one or more within the object and the scope of the present invention. Each of the elements may be implemented as independent hardware. Alternatively, some or all of the elements may be selectively combined into a computer program having a program module performing some or all functions combined in one or more pieces of hardware. A plurality of codes and code segments constituting the computer program may be easily reasoned by those skilled in the art to which the present invention pertains. The computer program may be stored on computer readable media such that the computer program is read and executed by a computer to implement embodiments of the present invention. Computer program storage media may include magnetic recording media, optical recording media, etc.

In the following description of the embodiments, it will be understood that, when each element is referred to as being formed "on" (above) or "under" (below) or "before" (ahead) or "after" (behind) the other element, it can be directly "on" (above) or "under" (below) or "before" (ahead) or "after" (behind) the other element or be indirectly formed with one or more intervening elements therebetween.

The term "comprises", "includes", or "has" described herein should be interpreted not to exclude other elements but to further include such other elements since the corresponding elements may be inherent unless mentioned otherwise. All terms including technical or scientific terms have the same meanings as generally understood by a person having ordinary skill in the art to which the present invention pertains unless mentioned otherwise. Generally used terms, such as terms defined in a dictionary, should be interpreted to coincide with meanings of the related art from the context. Unless obviously defined in the present invention, such terms are not interpreted as having ideal or excessively formal meanings.

It will be understood that, although the terms first, second, A, B, (a), (b), etc. may be used herein to describe various elements of the present invention, these terms are only used to distinguish one element from another element and necessity, order, or sequence of corresponding elements are not limited by these terms. It will be understood that when one element is referred to as being "connected to", "coupled to", or "accessing" another element, one element may be "connected to", "coupled to", or "accessing" another element via a further element although one element may be directly connected to or directly access another element.

In describing the present invention, if it is determined that the detailed description of a related known function or construction renders the scope of the present invention unnecessarily ambiguous, the detailed description thereof will be omitted.

FIG. 1 is a diagram illustrating a conventional temperature compensation method of a grip sensor using an external pin.

Referring to FIG. 1, a conventional grip sensing apparatus 100 includes first to N-th grip sensing pads 110, first to N-th sensing line elements 120, a grip sensing chip 130, a main processor 140 and a reference sensing element 150.

The grip sensing chip 130 includes first to N-th grip channel ports 131, a communication port 132, a grip interrupt port 133 and a reference channel port 134.

Each of the first to N-th grip sensing pads 110 may include a grip sensing electrode.

As shown in FIG. 1, each grip sensing pad may be electrically connected to a sensing line element corresponding thereto and the sensing line element may be connected to the grip channel port of the grip sensor chip 130 corresponding thereto.

The reference channel port 134 is connected to an external reference sensing element 150.

The representative example of the conventional reference sensing element 150 is a temperature sensor for sensing an external temperature.

The grip sensor chip 130 may acquire temperature sensing information through the reference channel port 134 and perform temperature compensation with respect to grip sensing data based on the acquired temperature sensing information. For example, the reference channel port may be connected to the input terminal of an analog-to-digital converter (ADC) provided in the grip sensor chip 130.

The conventional reference sensing element 150 may be implemented by an external copper pattern, a wiring, an external passive element such as a resistor and a capacitor, an IC pin, a wafer pad, etc.

The conventional grip sensor chip 130 is configured in a logic form and thus software modification is impossible.

The grip sensor chip 130 may exchange information with a main processor 140 through a communication port 132.

In addition, the grip sensor chip 130 may detect a grip event based on temperature-compensated grip sensing data and transmit a result of sensing to the main processor 140 through the grip interrupt port 133.

The main processor 140 may control operation of an electronic apparatus according to the sensed grip event.

Figure 2:
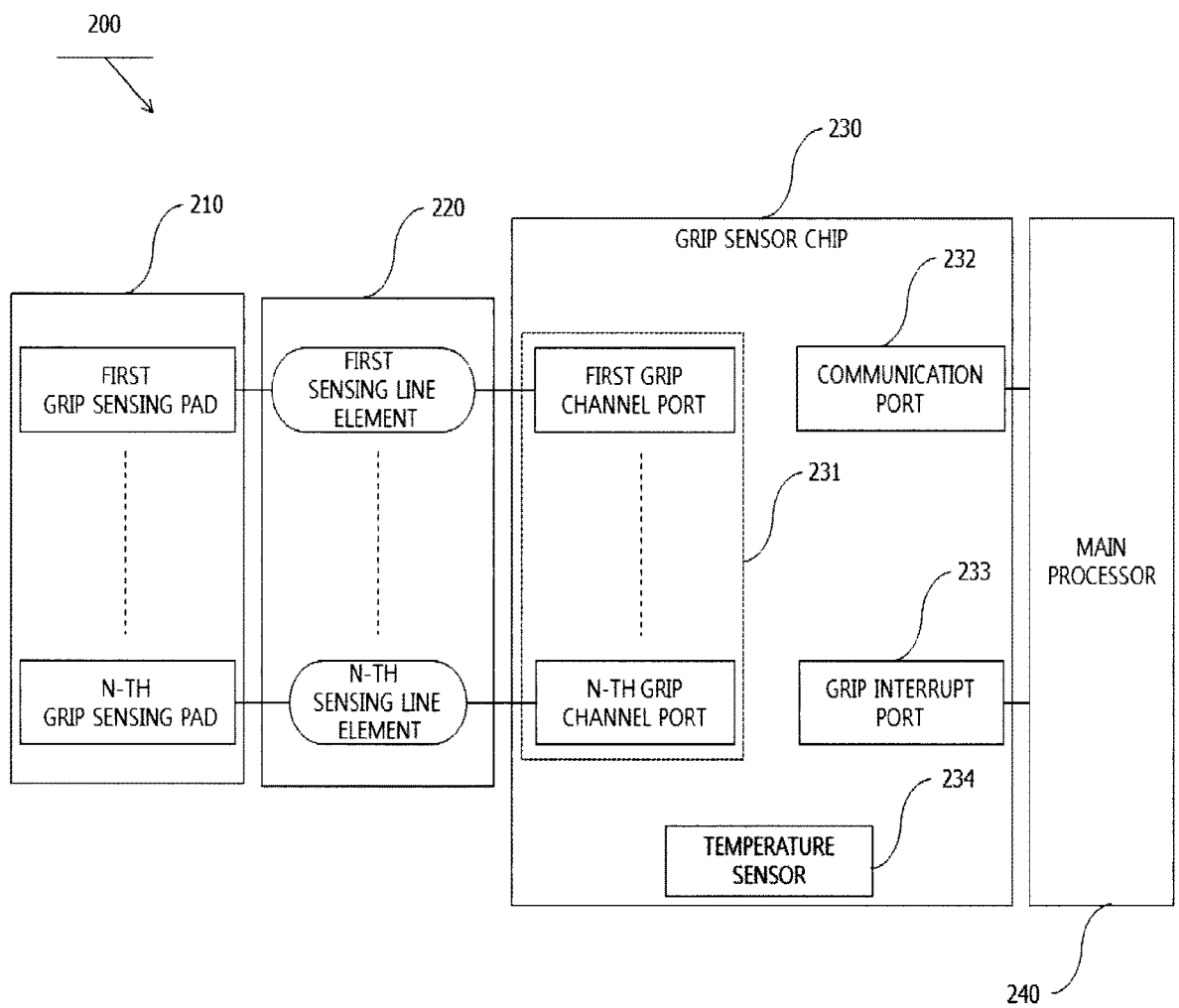
FIG. 2 is a diagram illustrating a grip sensor chip having a temperature sensor mounted therein according to an embodiment and a grip sensing method using the same.

FIG. 2 is a diagram illustrating a grip sensor chip having a temperature sensor mounted therein according to an embodiment and a grip sensing method using the same.

Referring to FIG. 2, a grip sensing apparatus 200 according to the embodiment may include first to N-th grip sensing pads 210, first to N-th sensing line elements 220, a grip sensing chip 230 and a main processor 240.

The grip sensing chip 230 may include first to N-th grip channel ports 231, a communication port 132, a grip interrupt port 133 and a temperature sensor 234.

Each of the first to N-th grip sensing pads 210 may include a grip sensing electrode.

As shown in FIG. 2, each grip sensing pad may be electrically connected to a sensing line element corresponding thereto and the sensing line element may be connected to a grip channel port of the grip sensing chip 230 corresponding thereto.

The sensing line element may include at least one capacitor and/or at least one varistor.

In particular, since a temperature sensor 234 for temperature compensation is mounted in the grip sensing chip 230 unlike the conventional reference sensing element 150, a separate port (or pin) for temperature sensing and a wiring are not required.

The grip sensing chip 230 may detect a temperature change through the temperature sensor 234 mounted therein and perform temperature compensation for dynamically correcting grip sensing data, more particularly, baseline data, according to the sensed temperature change.

A detailed temperature compensation method will become more apparent through the description of the drawings.

The grip sensing chip 230 according to the embodiment may be configured in an MCU type in which software update is possible.

Accordingly, the grip sensing apparatus 200 according to the embodiment may detect a temperature change in real time in the grip sensing chip 230 and provide a structure in which various software solutions may be developed and improved.

The grip sensing chip 230 may exchange information with the main processor 240 through a communication port 232. Here, the communication port 232 may support an I2C interface, a serial peripheral interface (SPI), etc.

In addition, the grip sensing chip 230 may detect various events based on the temperature-compensated grip sensing data and transmit a result of sensing to the main processor 240 through the grip interrupt port 233.

The main processor 240 may control operation of an electronic apparatus according to the sensed event.

In some embodiments, the event may include a touch detect event, a touch release event, a grip detect event, a grip release event, etc.

The sensing line element generates a nonlinear change in various parasitic capacitances according to different temperature characteristics of various passive elements such as a resistor, an inductor, a capacitor and a printed circuit board (PCB). The nonlinear capacitance characteristics of the passive elements according to the temperature change may become more apparent through the description of FIG. 4.

Figure 3:
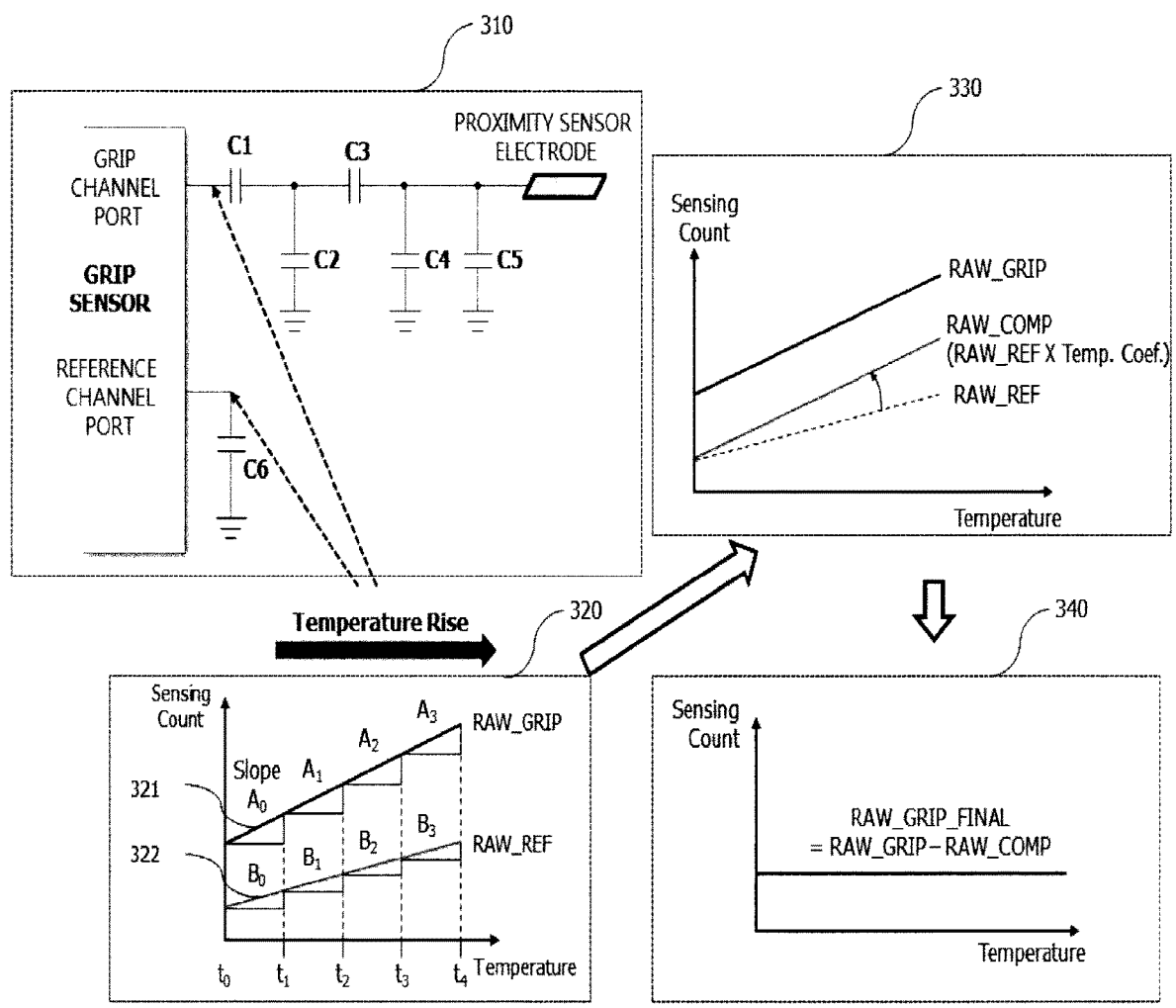
FIG. 3 is a diagram illustrating a linear temperature compensation method according to a temperature change.

FIG. 3 is a diagram illustrating a linear temperature compensation method according to a temperature change.

Referring to reference numeral 310 of FIG. 3, a plurality of passive elements C1 to C5 configuring a grip sensing channel may be disposed between a proximity sensor electrode and a grip channel port of a grip sensor chip. In addition, a passive element C6 configuring a reference channel for temperature measurement may be disposed between the ground and a reference channel port of the grip sensor chip.

Referring to reference numeral 320, a RAW_GRIP graph 321 and a RAW-REF graph 322 in a linear temperature compensation method assume that a sensing count linearly increases according to temperature rise. That is, the RAW_GRIP graph 321 and the RAW-REF graph 322 have the same slope in all temperature ranges.

Here, the RAW_GRIP graph 321 shows a sensing count change pattern according to a temperature change in the grip channel port and the RAW-REF graph 322 shows a sensing count change pattern according to a temperature change in the reference channel port.

Referring to reference numeral 330, in the linear temperature compensation method, temperature compensation of a reference channel may be performed by applying an ideal linear temperature coefficient TEMP.COEF to a RAW-REF value.

Thereafter, a temperature-compensated sensing count value RAW_COMP of the reference channel may be subtracted from the sensing count value RAW_GRIP of the grip channel, thereby acquiring a constant final sensing count value RAW_GRI_FINAL as shown in reference numeral 340. The grip sensor chip may compare the final sensing count value with a predetermined threshold, thereby detecting whether a grip event occurs.

Figure 4:
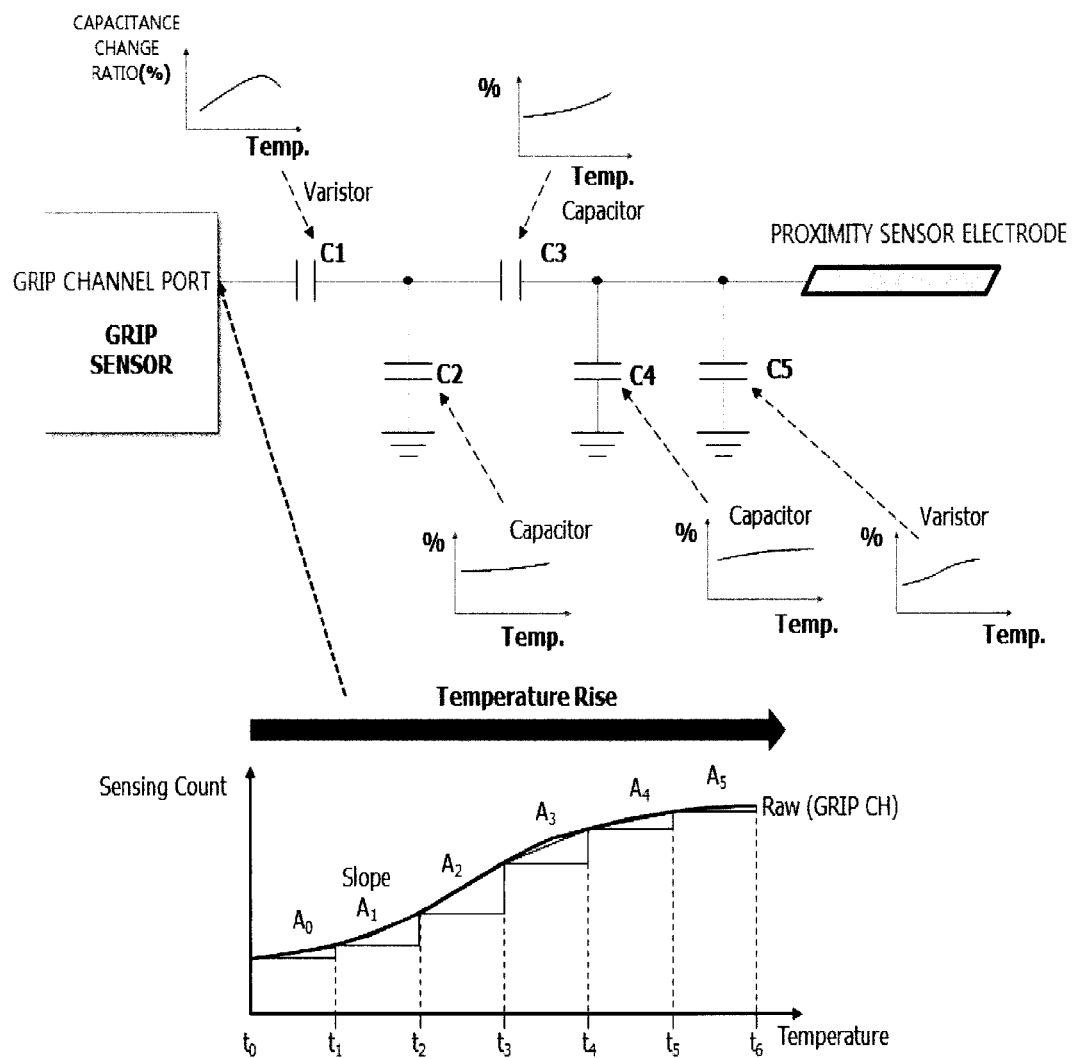
FIG. 4 is a diagram illustrating problems of linear temperature compensation according to a temperature change.

FIG. 4 is a diagram illustrating problems of linear temperature compensation according to a temperature change.

Referring to FIG. 4, the passive elements disposed between the proximity sensor electrode and the grip channel port of the grip sensor chip have different temperature characteristics.

That is, a capacitance change ratio according to a temperature change may differ between passive elements.

Accordingly, a capacitance change ratio according to the temperature change of the actual passive element has a nonlinear characteristic. In addition, a capacitance change ratio according to temperature of the grip channel port may be nonlinear according to the characteristics of a substrate on which the grip channel port is disposed, such as a wire length, a multi-layer structure, etc.

That is, in a temperature compensation method using a linear temperature coefficient, it is difficult to accurately detect a grip event.

For example, even though a user does not grip an electronic apparatus, it may be determined that the user grips the electronic apparatus, thereby causing malfunction and unnecessary power consumption of the electronic apparatus.

Figure 5:
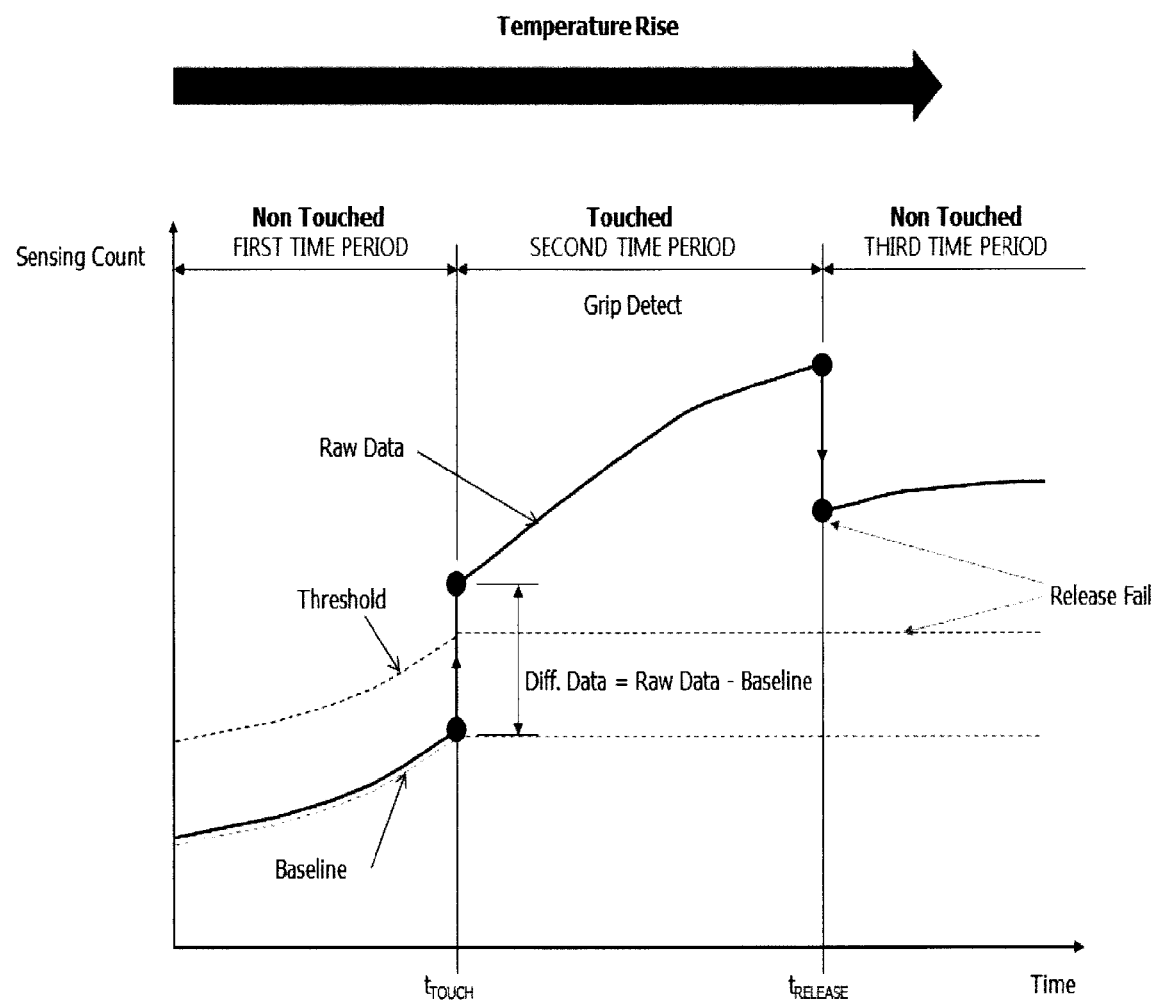
FIG. 5 is a diagram illustrating the reason why temperature compensation is necessary for a grip sensing apparatus.

FIG. 5 is a diagram illustrating the reason why temperature compensation is necessary for a grip sensing apparatus.

Referring to FIG. 5, assume that user's touch is not sensed during a first time period, touch of user on a grip pad is sensed at a time point $t_{TOUCH}$, and user's touch is finished at a time point $t_{RELEASE}$ after being maintained during a second time period.

During the first time period, the sensing count value of the grip channel forms a baseline. That is, the grip sensing chip may perform baseline tracking during the first time period. Generally, baseline tracking is performed to determine whether grip is sensed based on the sensing count value.

When touch is made at the time point $t_{TOUCH}$, baseline tracking may be finished and the baseline may be fixed to a most recently determined baseline count value.

When touch is made at the time point $t_{TOUCH}$, a threshold changed with a certain offset may also be changed according to the baseline.

When touch is made at the time point $t_{TOUCH}$, the sensing count value of the grip channel rises to the threshold or more. At this time, the grip sensing chip may detect touch operation.

Thereafter, when the temperature rises, the sensing count value of the grip channel, that is, RAW data, may increase during the second time period.

When user's touch is released at a time point $t_{RELEASE}$, the sensing count value of the grip channel decreases.

However, when the sensing count value decreased according to touch release is equal to or greater than a threshold or more, the grip sensing chip cannot detect touch release operation of a user. That is, a grip lock phenomenon (a phenomenon wherein a touch state is not released and a grip detect state is continuously maintained) occurs.

That is, when appropriate temperature compensation is not performed with respect to the baseline, the grip sensing chip cannot accurately detect a grip event.

Figure 6:
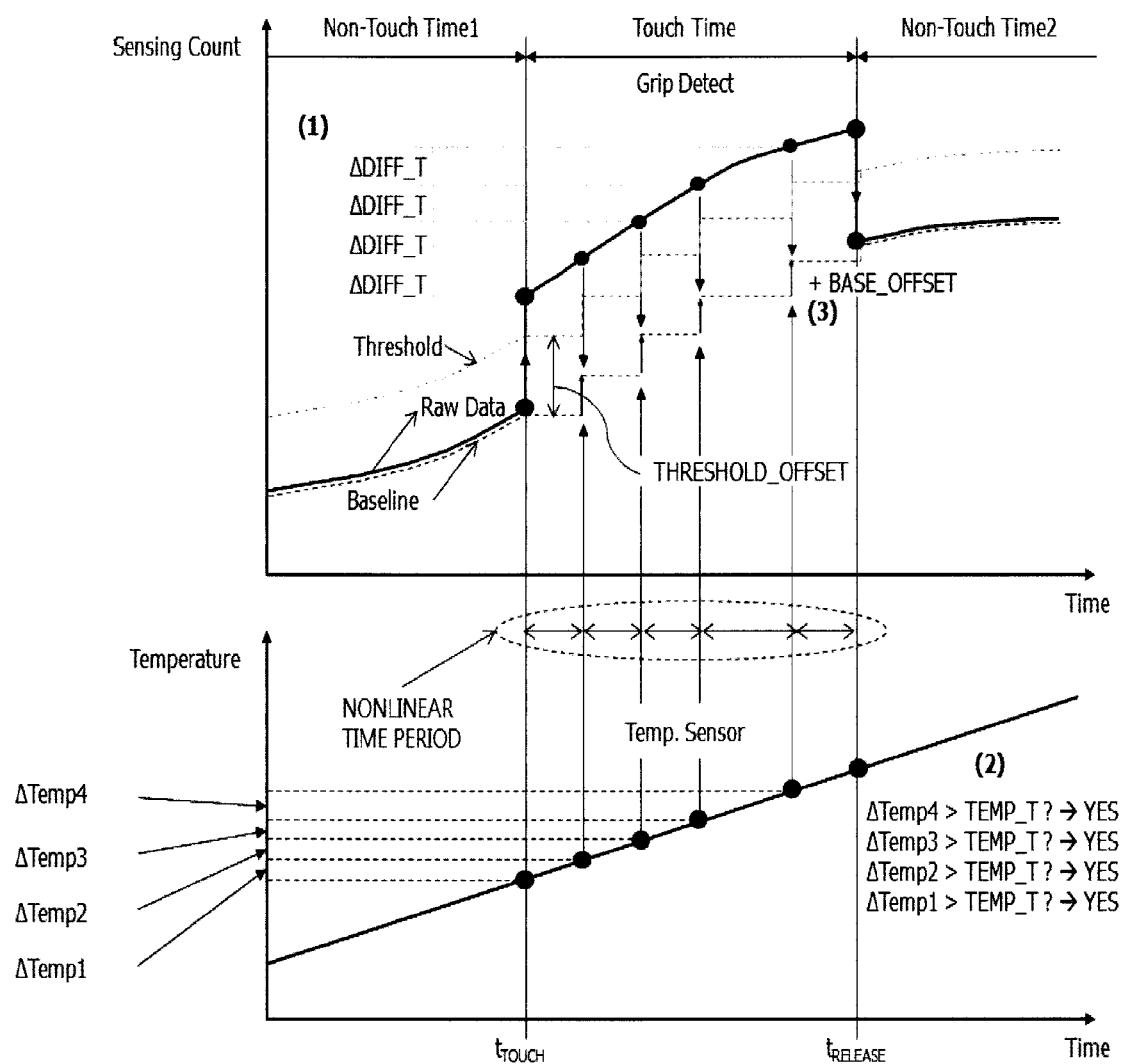
FIG. 6 is a diagram illustrating a temperature compensation method in a grip sensing apparatus having a temperature sensor mounted therein according to an embodiment.

FIG. 6 is a diagram illustrating a temperature compensation method in a grip sensing apparatus having a temperature sensor mounted therein according to an embodiment.

Referring to 6, the grip sensing apparatus according to the embodiment may perform temperature compensation only in a period in which touch is sensed. That is, temperature compensation may not be performed before touch sensing, that is, in Non-Touch Time1 and Non-Touch Time2.

The grip sensing apparatus performs baseline tracking in Non-Touch Time1, stops baseline tracking when touch is sensed at the time point $t_{TOUCH}$, and start a temperature compensation procedure with respect to the baseline and the threshold. Here, temperature compensation may be performed such that the baseline and the threshold have a certain offset THRESHOLD_OFFSET.

The grip sensing apparatus according to the embodiment may calculate a temperature change amount ΔTemp using a temperature sensor provided in the grip sensing chip only when RawData (or Diff. Data) is changed by a certain base value DIFF_T or more and perform temperature compensation with respect to the baseline and the threshold only when the calculated temperature change amount exceeds a predetermined base value TEMP_T. Therefore, the grip sensing apparatus may perform temperature compensation at a nonlinear time period.

The grip sensing apparatus may apply a predefined base offset BASE_OFFSET to the baseline and the threshold to perform temperature compensation when the temperature change amount exceeds the base value.

The grip sensing apparatus may calculate a temperature change slope.

The grip sensing apparatus may add a base offset BASE_OFFSET to the baseline and the threshold to perform temperature compensation in a touch time, when the calculated slope has a positive value.

The grip sensing apparatus may subtract a base offset BASE_OFFSET from the baseline and the threshold to perform temperature compensation in a touch time, when the calculated slope has a negative value.

The grip sensing apparatus may determine that the sensed grip is released and generates a predetermined grip release interrupt signal, when RawData (or Diff. Data) falls below the temperature-compensated threshold (or a threshold from which the temperature-compensated baseline is subtracted).

The grip sensing apparatus according to the embodiment may perform control such that the temperature-compensated threshold is maintained at a predetermined lower-limit base value MINUS_LIMIT or more. Since the temperature rarely decreases in an actual grip state, it is possible to prevent malfunction.

Figure 7:
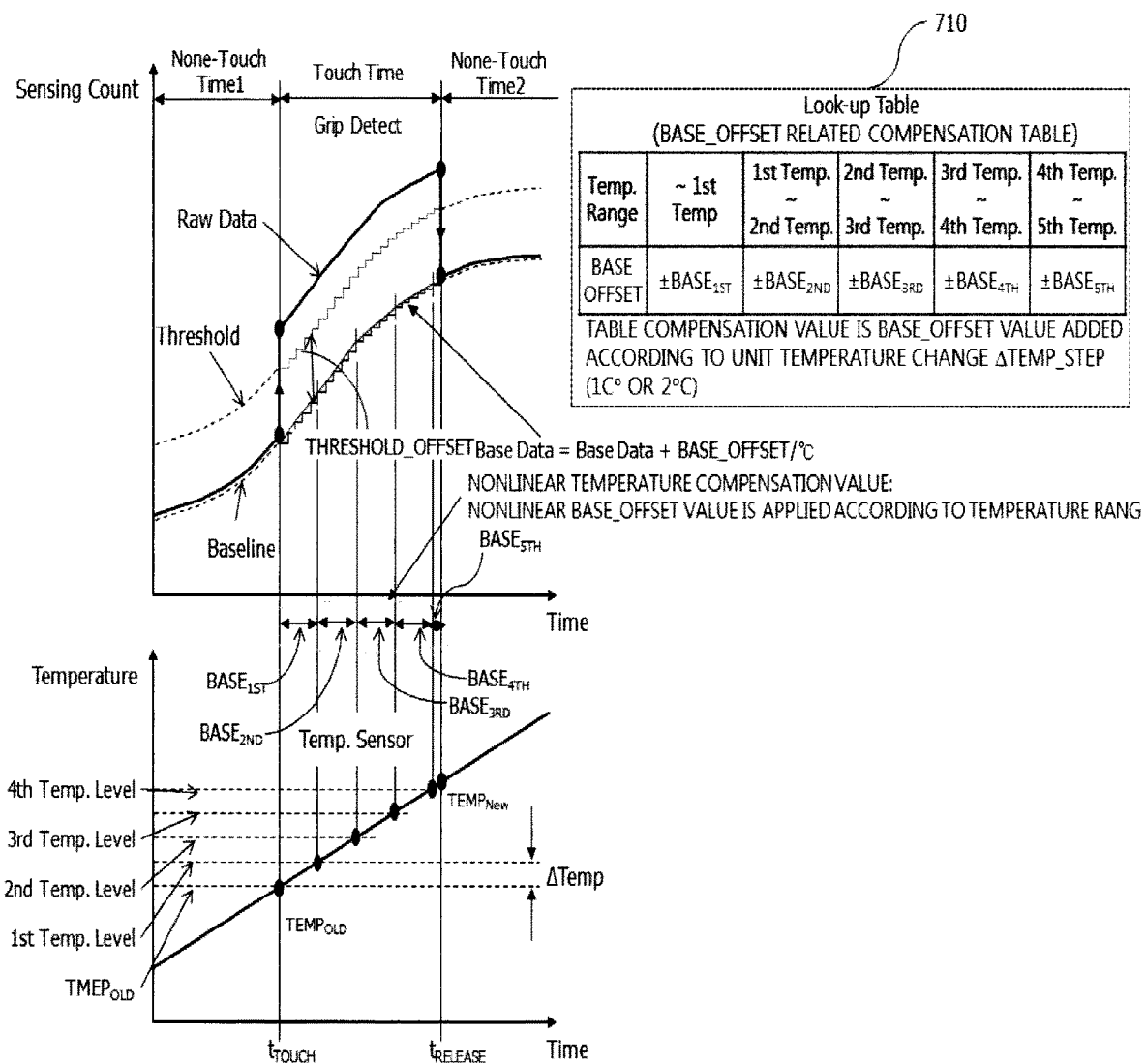
FIG. 7 is a diagram illustrating a temperature compensation method in a grip sensing apparatus having a temperature sensor mounted therein according to another embodiment.

FIG. 7 is a diagram illustrating a temperature compensation method in a grip sensing apparatus having a temperature sensor mounted therein according to another embodiment.

Referring to FIG. 7, the grip sensing apparatus according to the embodiment may perform temperature compensation only in a touch time. That is, temperature compensation may not be performed before touch sensing, that is, in Non-Touch Time1 and Non-Touch Time2.

The grip sensing apparatus may perform baseline tracking in Non-Touch Time1, stop baseline tracking when touch is sensed at a time point $t_{TOUCH}$, and start a temperature compensation procedure with respect to the baseline and threshold. Here, temperature compensation may be performed such that the baseline and the threshold have a certain offset THRESHOLD_OFFSET.

The grip sensing apparatus according to the embodiment may monitor a temperature change using a temperature sensor provided in the grip sensing chip only when RawData (or Diff. Data) is changed by a certain base value DIFF_T or more. The grip sensing apparatus may determine a base offset corresponding to a current temperature by referring to a look-up table denoted by reference numeral 710 whenever there is a unit temperature change (ΔTEMP_STEP) such as 1° C. or 2° C. At this time, in the look-up table 710, different base offset values may be defined in defined temperature ranges.

Therefore, it is possible to improve temperature compensation accuracy, by effectively applying different capacitance change ratios of the passive elements according to the temperature range.

The grip sensing apparatus may measure a temperature change amount ΔTemp during a unit time and perform temperature compensation with respect to the baseline and the threshold by referring to the look-up table 710 only when the measured temperature change amount exceeds a predetermined base value TEMP_T. Therefore, the grip sensing apparatus may perform temperature compensation for applying a nonlinear base offset according to a temperature range in a touch time.

The grip sensing apparatus may perform temperature compensation by applying the determined base offset BASE_OFFSET to the baseline and the threshold, when the temperature change amount exceeds the base value.

The grip sensing apparatus may calculate a temperature change slope.

The grip sensing apparatus may update a baseline count by adding the baseline count to a value obtained by multiplying the unit temperature change ΔTEMP_STEP by the determined base offset and perform temperature compensation with respect to the touch time, when the calculated slope has a positive value. Here, the baseline count before update may have a sensing count value calculated immediately before a time point $t_{TOUCH}$.

The grip sensing apparatus may perform temperature compensation for updating a baseline count by subtracting, from the baseline count, a value obtained by multiplying the unit temperature change ΔTEMP_STEP by the determined base offset and perform temperature compensation, when the calculated slope has a negative value.

The grip sensing apparatus may determine that the sensed grip is released and generate a predetermined grip release interrupt signal, when RawData (or Diff. Data) falls below the temperature-compensated threshold (or a threshold from which the temperature-compensated baseline is subtracted).

The grip sensing apparatus according to the embodiment may perform control such that the temperature-compensated threshold is maintained at a predetermined lower-limit base value MINUS_LIMIT or more. Since the temperature rarely decreases in an actual grip state, it is possible to prevent malfunction.

Figure 8:
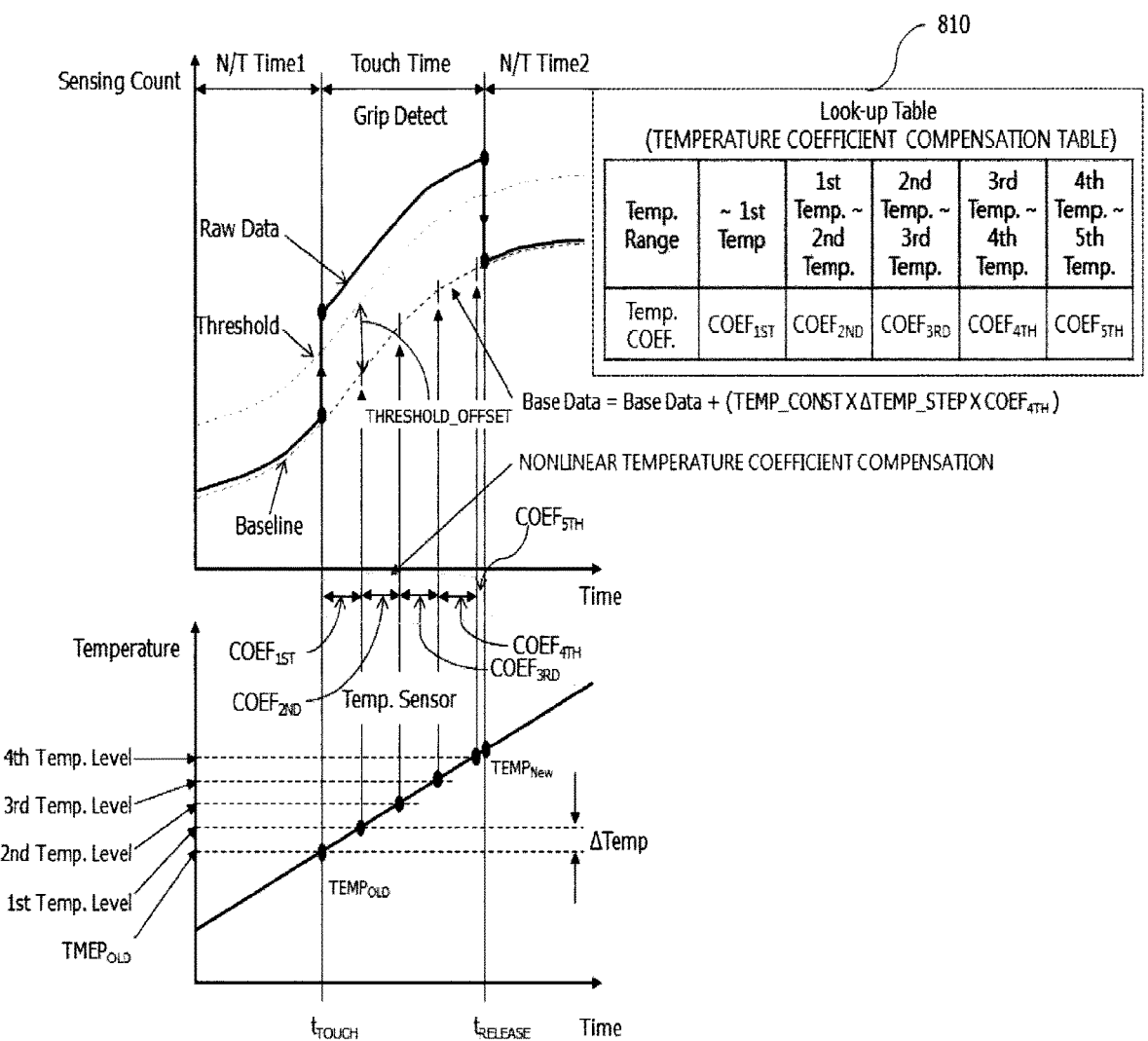
FIG. 8 is a diagram illustrating a temperature compensation method in a grip sensing apparatus having a temperature sensor mounted therein according to another embodiment.

FIG. 8 is a diagram illustrating a temperature compensation method in a grip sensing apparatus having a temperature sensor mounted therein according to another embodiment.

Referring to FIG. 8, the grip sensing apparatus according to the embodiment may perform temperature compensation only in a touch time. That is, temperature compensation may not be performed before touch sensing, that is, in Non-Touch Time1 and Non-Touch Time2.

The grip sensing apparatus may perform baseline tracking in Non-Touch Time1, stop baseline tracking when touch is sensed at a time point $t_{TOUCH}$, and start a temperature compensation procedure with respect to the baseline and threshold. Here, temperature compensation may be performed such that the baseline and the threshold have a certain offset THRESHOLD_OFFSET.

The grip sensing apparatus according to the embodiment may monitor a real-time temperature change using a temperature sensor provided in the grip sensing chip only when RawData (or Diff. Data) is changed by a certain base value DIFF_T or more. The grip sensing apparatus may determine a temperature coefficient TEMP.COEF corresponding to a current temperature by referring to a look-up table denoted by reference numeral 810 whenever there is a unit temperature change ΔTEMP_STEP such as 1° C. or 2° C. At this time, in the look-up table 810, different base offset values may be defined in defined temperature ranges. Referring to FIG. 8, in base data update calculation, TEMP_CONST may be a constant for adding or subtracting a certain value through calculation with TEMP_STEP and TEMP.COEF.

Therefore, it is possible to improve temperature compensation accuracy, by effectively applying different capacitance change ratios of the passive elements according to the temperature range.

The grip sensing apparatus may measure a temperature change amount Temp during a unit time and perform temperature compensation with respect to the baseline and the threshold by referring to the look-up table 810 only when the measured temperature change amount exceeds a predetermined base value TEMP_T. Therefore, the grip sensing apparatus may perform temperature compensation for applying a nonlinear base offset according to a temperature range in a touch time.

The grip sensing apparatus may perform temperature compensation by applying the determined base offset BASE_OFFSET to the baseline and the threshold, when the temperature change amount during the unit time exceeds the base value.

The grip sensing apparatus may calculate a temperature change slope.

The grip sensing apparatus may update a baseline count by multiplying the baseline count by the unit temperature change ΔTEMP_STEP and the determined base offset, when the calculated slope has a positive value.

The grip sensing apparatus may update a baseline count by multiplying the baseline count by the unit temperature change ΔTEMP_STEP and then dividing the multiplied value by the determined temperature coefficient TEMP.COEF, when the calculated slope has a negative value.

The grip sensing apparatus may determine that the sensed grip is released and generates a predetermined grip release interrupt signal, when RawData (or Diff. Data) falls below the temperature-compensated threshold (or a threshold from which the temperature-compensated baseline is subtracted).

The grip sensing apparatus according to the embodiment may perform control such that the temperature-compensated threshold is maintained at a predetermined lower-limit base value MINUS_LIMIT or more. Since the temperature rarely decreases in an actual grip state, it is possible to prevent malfunction.

Figure 9:
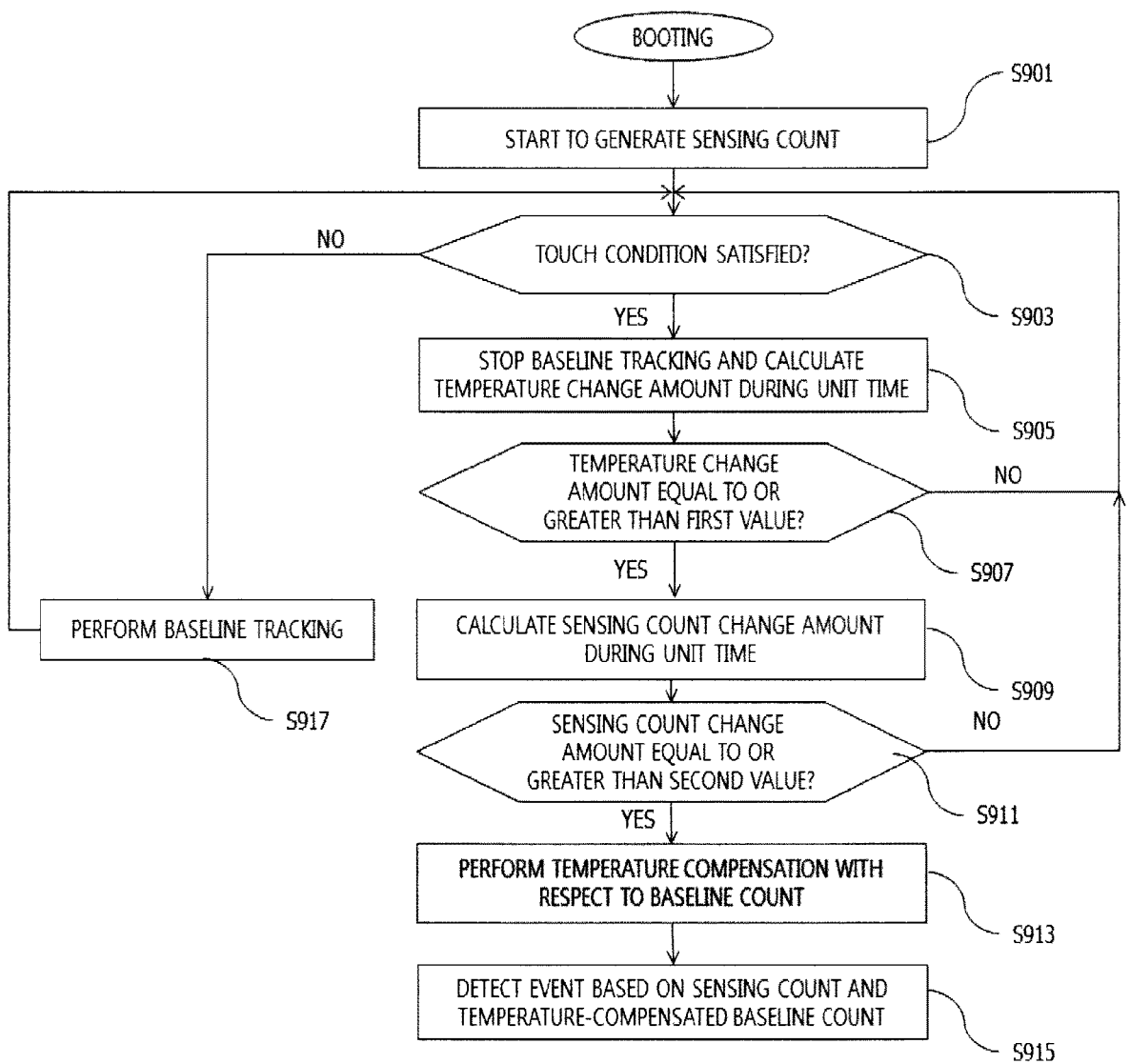
FIG. 9 is a flowchart illustrating a temperature compensation method in a grip sensing apparatus having a temperature sensor mounted therein according to another embodiment.

FIG. 9 is a flowchart illustrating a temperature compensation method in a grip sensing apparatus having a temperature sensor mounted therein according to another embodiment.

Referring to FIG. 9, the grip sensing apparatus may sense a sensing count when booting is performed (S901). Here, the sensing count may be generated by differentially amplifying a voltage potential of the grip channel based on a predetermined correction offset and performing digital conversion.

The grip sensing apparatus may determine whether a touch condition is satisfied (S903).

For example, the grip sensing apparatus may determine that the touch condition is satisfied when the sensing count exceeds a predetermined base value during the baseline tracking For example, the base value used to determine whether the touch condition is satisfied may have a value different from a threshold used to determine whether a grip event occurs.

When the touch condition is satisfied, the grip sensing apparatus may end baseline tracking and calculate a temperature change amount during a unit time (S905).

The grip sensing apparatus may determine whether the temperature change amount is equal to or greater than a first value CONT_T (S907).

Upon determining that the temperature change amount is equal to or greater than the first value, the grip sensing apparatus may calculate a sensing count change amount during a unit time (S909).

The grip sensing apparatus may determine whether the sensing count change amount is equal to or greater than a second value TEMP_T (S911).

Upon determining that the sensing count change amount is equal to or greater than the second value, the grip sensing apparatus may perform temperature compensation with respect to the baseline count (S913). At this time, the grip sensing apparatus may correct the threshold based on the temperature-compensated baseline count.

The grip sensing apparatus may sense an event based on the sensing count corresponding to the grip channel and the temperature-compensated baseline count (S915).

Here, the event may include a grip release event indicating that grip is released, without being limited thereto.

Figure 10:
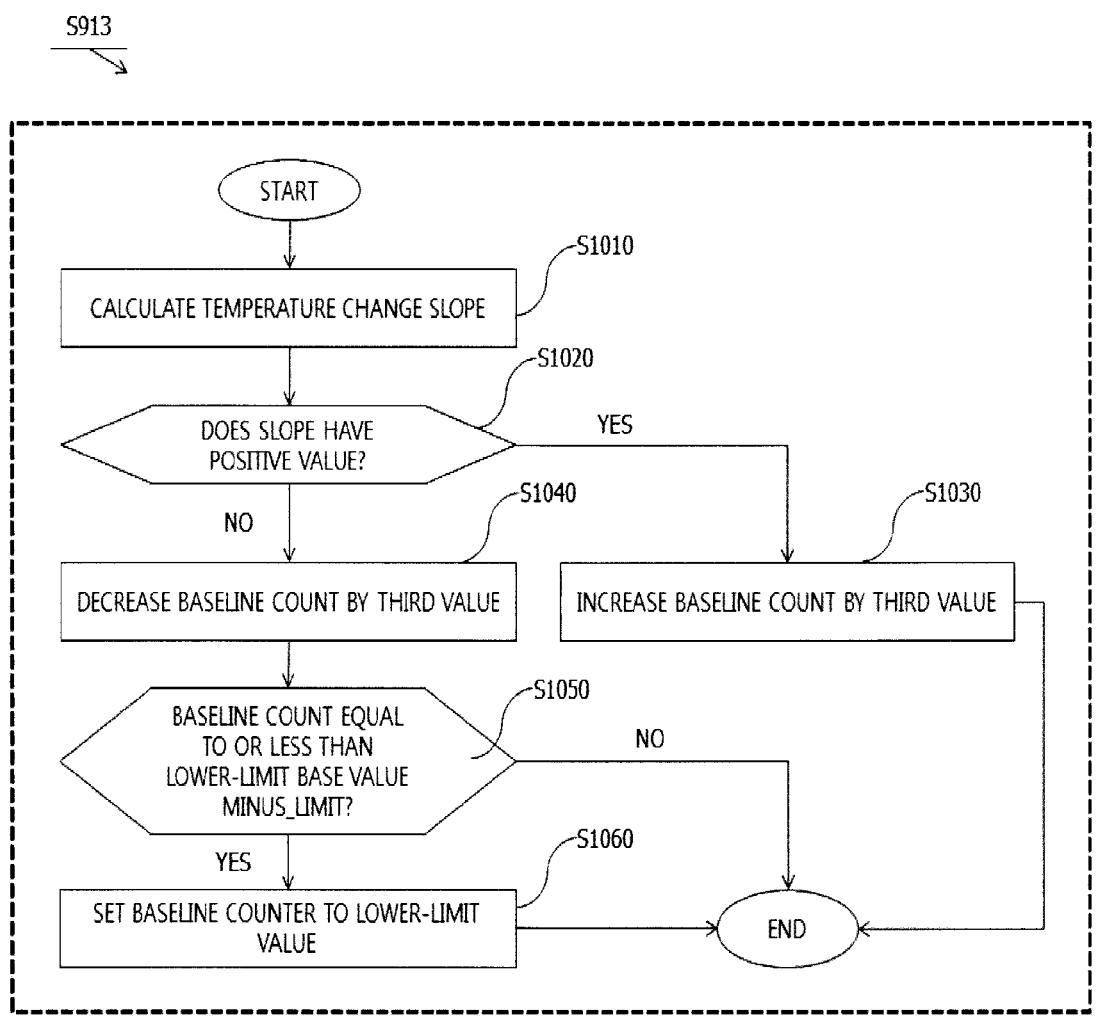
FIG. 10 is a flowchart illustrating a temperature compensation method according to an embodiment.

FIG. 10 is a flowchart illustrating a temperature compensation method according to an embodiment.

Specifically, FIG. 10 shows the detailed configuration of step S913 of FIG. 9.

Referring to FIG. 10, the grip sensing apparatus may calculate the temperature change slope (S1010).

The grip sensing apparatus may determine whether the calculated slope has a positive value (S1020).

Upon determining that the calculated slope has a positive value, the grip sensing apparatus may increase the baseline count by a predefined third value (S1030).

Upon determining that the calculated slope has a negative value in S1020, the grip sensing apparatus may decrease the baseline count by the predetermined third value (S1040).

The grip sensing apparatus may determine whether the decreased baseline count is equal to or less than a predetermined lower-limit base value MINUS_LIMIT (S1050).

Upon determining that the temperature-compensated baseline count is equal to or less than the predetermined lower-limit base value MINUS_LIMIT, the grip sensing apparatus may set the baseline count as a lower-limit base value (S1060).

Figure 11:
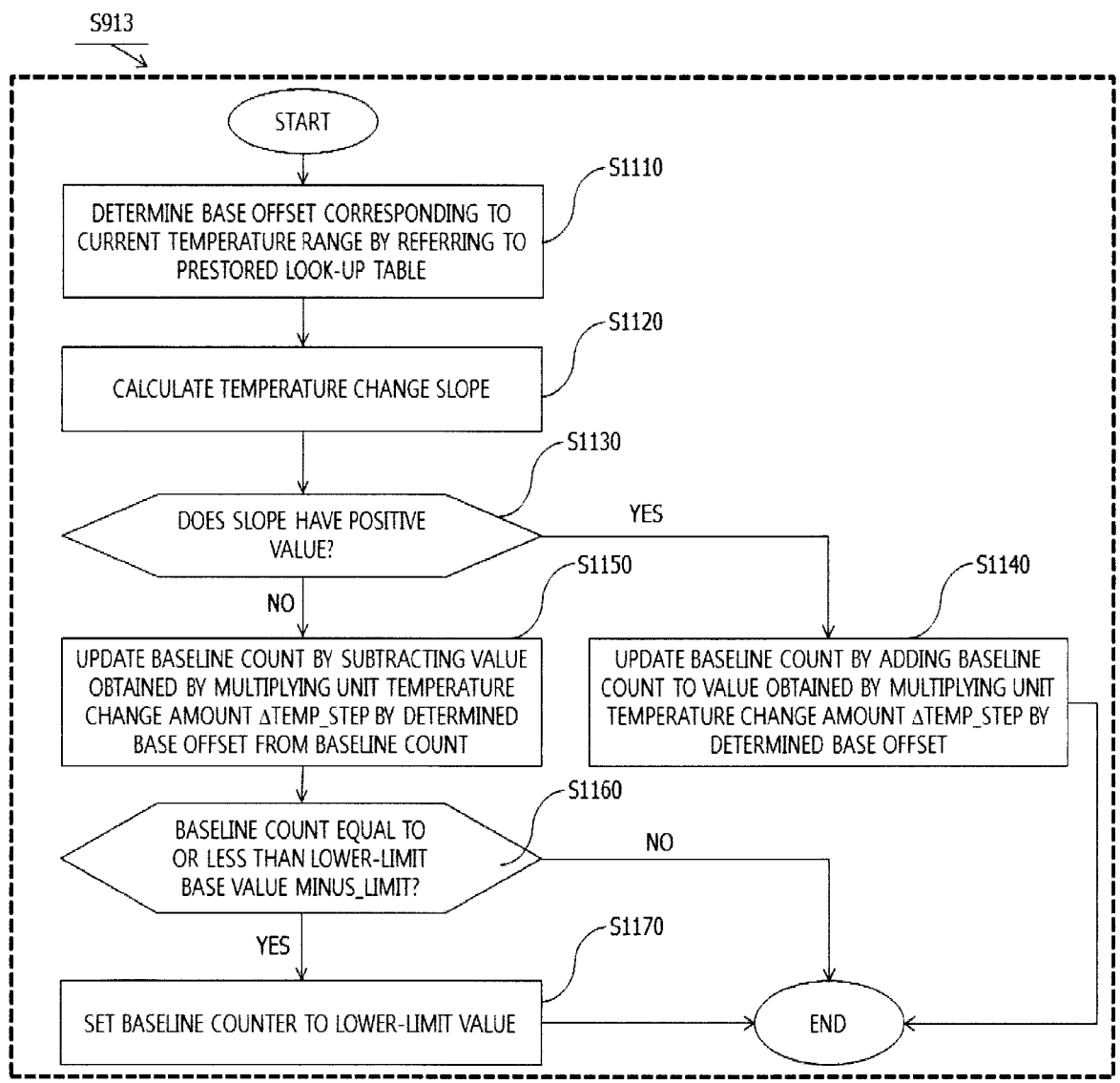
FIG. 11 is a flowchart illustrating a temperature compensation method according to another embodiment.

FIG. 11 is a flowchart illustrating a temperature compensation method according to another embodiment.

Specifically, FIG. 11 shows the detailed configuration of step S913 of FIG. 9.

Referring to FIG. 11, the grip sensing apparatus may determine a base offset corresponding to a current temperature range by referring to the prestored look-up table denoted by reference numeral 710 of FIG. 7 (S1110).

The grip sensing apparatus may calculate a temperature change slope (S1120).

The grip sensing apparatus may determine whether the calculated slope has a positive value (S1130).

Upon determining that the calculated slope has a positive value, the grip sensing apparatus may update the baseline count by adding the baseline count to a value obtained by multiplying the unit temperature change $\Delta TEMP\_STEP$ by the determined base offset (S1140).

Upon determining that the calculated slope has a negative value in S1020, the grip sensing apparatus may update the baseline count by subtracting, from the baseline count, the value obtained by multiplying the unit temperature change $\Delta TEMP\_STEP$ by the determined base offset (S1150).

The grip sensing apparatus may determine whether the decreased baseline count is equal to or less than the predetermined lower-limit base value MINUS_LIMIT (S1160).

Upon determining that the temperature-compensated baseline count is equal to or less than the predetermined lower-limit base value MINUS_LIMIT, the grip sensing apparatus may set the baseline count as a lower-limit base value (S1170).

Figure 12:
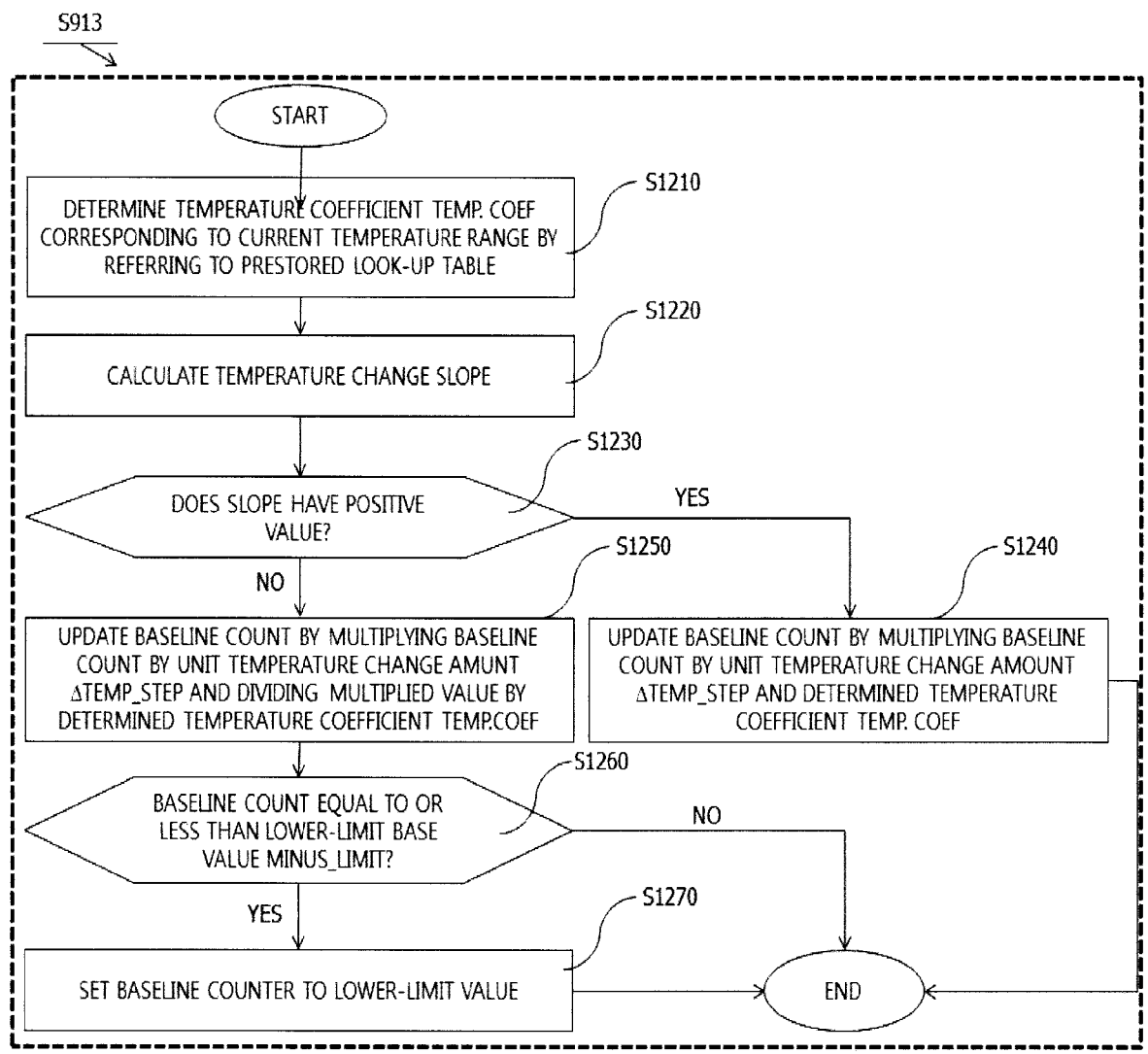
FIG. 12 is a flowchart illustrating a temperature compensation method according to another embodiment.

FIG. 12 is a flowchart illustrating a temperature compensation method according to another embodiment.

Specifically, FIG. 12 shows the detailed configuration of step S913 of FIG. 9.

Referring to FIG. 12, the grip sensing apparatus may determine the temperature coefficient TEMP.COEF corresponding to the current temperature range by referring to the prestored look-up table denoted by reference numeral 810 of FIG. 8 (S1210).

The grip sensing apparatus may calculate a temperature change slope (S1220).

The grip sensing apparatus may determine whether the calculated slope has a positive value S1230).

Upon determining that the calculated slope has a positive value, the grip sensing apparatus may update the baseline count by multiplying the baseline count by the unit temperature change $\Delta TEMP\_STEP$ and the determined temperature coefficient TEMP. COEF (S1240).

Upon determining that the calculated slope has a negative value in S1020, the grip sensing apparatus may update the baseline count by multiplying the baseline count by the unit temperature change $\Delta TEMP\_STEP$ and then dividing the multiplied value by the determined temperature coefficient TEMP.COEF (S1250).

The grip sensing apparatus may determine whether the decreased baseline count is equal to or less than the predetermined lower-limit base value MINUS_LIMIT (S1260).

Upon determining that the temperature-compensated baseline count is equal to or less than the predetermined lower-limit base value MINUS_LIMIT, the grip sensing apparatus may set the baseline count as a lower-limit base value (S1270).

Figure 13:
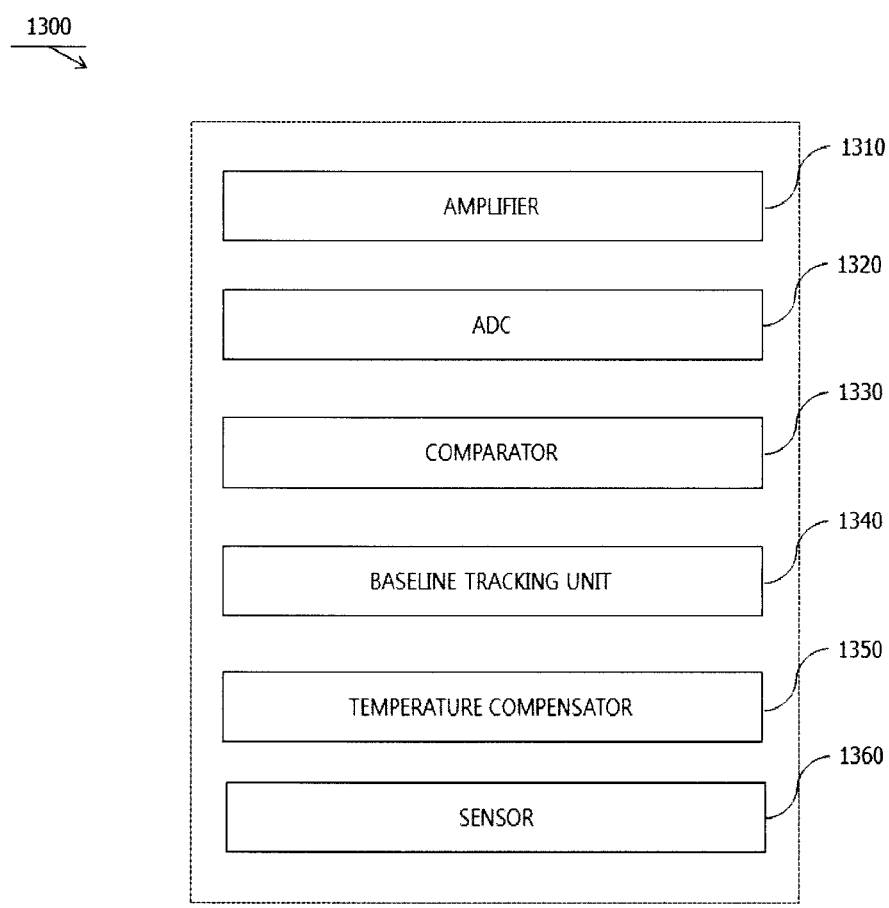
FIG. 13 is a block diagram illustrating the structure of a grip sensing apparatus according to an embodiment.

FIG. 13 is a block diagram illustrating the structure of a grip sensing apparatus according to an embodiment.

Referring to FIG. 13, the grip sensing apparatus 1300 may include an amplifier 1310, an analog-to-digital converter (ADC) 1320, a comparator 1330, a baseline tracking unit 1340, a temperature compensator 1350 and a sensing unit 1360.

The amplifier 1310 may differentially amplify the voltage potential of the grip channel based on a predetermined correction offset.

The ADC 1320 may perform digital conversion with respect to the output of the amplifier 1310 to generate a sensing count.

The comparator 1330 may compare the sensing count with a predetermined base value.

The baseline tracking unit 1340 may determine the baseline count based on the sensing count, when the current sensing count is less than the base value as the result of comparison by the comparator 1330.

The temperature compensator 1350 may stop baseline tracking and perform temperature compensation with respect to the baseline count using the temperature sensor provided therein, when the current sensing count is equal to or greater than the base value as the result of comparison by the comparator 1330.

The sensing unit 1360 may sense an event based on the sensing count of the grip channel and the temperature-compensated baseline count.

The sensing unit 1360 may include a unit for subtracting the temperature-compensated baseline count from the sensing count, a unit for comparing the subtracted value with a second base count value, a unit for determining a grip state when the subtracted value exceeds the second base count value, and a unit for determining that the grip state is released when the subtracted value is equal to or less than the second base count value.

The temperature compensator 1350 may include a unit for measuring a change amount of the sensing count during a first time, a unit for measuring a temperature change amount during the first time when the change amount of the sensing count exceeds a first value CONT_T, and a unit for updating the baseline count when the measured temperature change amount exceeds a second value TEMP_T.

The temperature compensator 1350 may further include a unit for determining the temperature change slope corresponding to the measured temperature change.

The temperature compensator 1350 according to the embodiment may determine the temperature coefficient TEMP.COEF corresponding to the temperature change range by referring to the prestored look-up table and update the baseline count based on the determined temperature coefficient and the determined slope.

Here, the temperature coefficient may be nonlinear according to the temperature change.

The temperature compensator 1350 may update the baseline count by multiplying the baseline count by the unit temperature change $\Delta TEMP\_STEP$ and the determined temperature coefficient when the calculated slope has a positive value, and update the baseline count by multiplying the baseline count by the unit temperature change $\Delta TEMP\_STEP$ and then dividing the multiplied value by the determined temperature coefficient when the calculated slope has a negative value.

The temperature compensator 1350 according to another embodiment may determine the base offset BASE_OFFSET corresponding to the temperature change range by referring to the prestored look-up table and update the baseline count based on the determined base offset and the determined slope.

The temperature compensator 1350 may update the baseline count by adding, to the baseline count, the value obtained by multiplying the unit temperature change ΔTEMP_STEP by the determined base offset when the determined slope has a positive value, and update the baseline count by subtracting, from the baseline count, the value obtained by multiplying the unit temperature change ΔTEMP_STEP by the determined base offset when the determined slope has a negative value.

The temperature compensator 1350 according to another embodiment may increase the baseline count by the third value when the determined slope has a positive value and decrease the baseline count by the third value when the determined slope has a negative value. Here, the third value may be set to a fixed value regardless of the temperature change range.

The temperature compensator 1350 according to the embodiment may perform temperature compensation such that the temperature-compensated baseline count is equal to or greater than the lower-limit base value MINUS_LIMIT.

The apparatus and system according to the present invention have the following effects.

It is possible to provide a grip sensing method capable of more accurately performing temperature compensation using a grip sensing chip having a temperature sensor mounted therein, and an apparatus therefor.

It is possible to provide a grip sensing method capable of more accurately detecting a grip event without a reference sensing element located outside a grip sensing chip for temperature compensation, and an apparatus therefor.

It is possible to provide a grip sensing method capable of performing nonlinear temperature compensation in consideration of a nonlinear capacitance change of a grip sensing channel including a plurality of passive elements according to a temperature change, and an apparatus therefor.

It is possible to provide a grip sensing apparatus having a simple internal circuit structure and low cost.

The effects of the present invention are not limited to the above-described effects and other effects which are not described herein may be derived by those skilled in the art from the above description of the embodiments of the present invention.

The invention can also be embodied as computer readable code on a computer readable recording medium. The computer readable recording medium is any data storage device that can store data which can thereafter be read by a computer system. Examples of the computer readable recording medium include read-only memory (ROM), random-access memory (RAM), CD-ROMs, magnetic tapes, floppy disks, and optical data storage devices.

The computer-readable recording medium can be distributed over a plurality of computer systems connected to a network so that computer-readable code is written thereto and executed therefrom in a decentralized manner. Functional programs, code, and code segments needed to realize the embodiments herein can be construed by one of ordinary skill in the art.

Those skilled in the art will appreciate that the present invention may be carried out in other specific ways than those set forth herein without departing from the spirit and essential characteristics of the present invention.

The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

What is claimed is:

1. A grip sensing method comprising:
    generating a sensing count by differentially amplifying a voltage potential of a grip channel based on a predetermined correction offset and performing digital conversion;
    comparing the sensing count with a predetermined base value to determine whether a touch condition is satisfied;
    performing baseline tracking for determining a baseline count based on the sensing count when the sensing count is less than the base value and the touch condition is not satisfied;
    stopping the baseline tracking and performing temperature compensation with respect to the baseline count using a temperature sensor mounted therein when the sensing count is equal to or greater than the base value and the touch condition is satisfied; and
    sensing an event based on the sensing count and the temperature-compensated baseline count.

2. The grip sensing method according to claim 1, wherein the sensing of the event includes:
    subtracting the temperature-compensated baseline count from the sensing count;
    comparing the subtracted value with a second base count value;
    determining that the event occurs when the subtracted value exceeds the second base count value as a result of comparison; and
    determining that the event does not occur when the subtracted value is equal to or less than the second base count value as the result of comparison.

3. The grip sensing method according to claim 1, wherein the performing of temperature compensation includes:
    measuring a change amount of the sensing count during a first time;
    measuring a temperature change amount during the first time when the change amount of the sensing count exceeds a first value; and
    updating the baseline count when the measured temperature change amount exceeds a second value.

4. The grip sensing method according to claim 3, wherein the updating of the baseline count further includes determining a slope corresponding to the measured temperature change amount.

5. The grip sensing method according to claim 4, wherein the updating of the baseline count includes:
    determining a temperature coefficient TEMP.COEF corresponding to a temperature change range by referring to a prestored look-up table; and
    updating the baseline count based on the determined temperature coefficient and the determined slope.

6. The grip sensing method according to claim 5, wherein the baseline count is updated by multiplying the baseline count by a unit temperature change ΔTEMP_STEP and the determined temperature coefficient when the calculated slope has a positive value, and the baseline count is updated by multiplying the baseline count by the unit temperature change and then dividing the multiplied value by the determined temperature coefficient when the calculated slope has a negative value.

7. The grip sensing method according to claim 6, wherein the temperature coefficient is nonlinear according to the temperature change.

8. The grip sensing method according to claim 4, wherein the updating of the baseline count includes:
   determining a base offset BASE_OFFSET corresponding to a temperature change range by referring to the prestored look-up table; and
   updating the baseline count based on the determined base offset and the determined slope.

9. The grip sensing method according to claim 8, wherein the baseline count is updated by adding, to the baseline count, the value obtained by multiplying the unit temperature change ΔTEMP_STEP by the determined base offset when the determined slope has a positive value, and the baseline count is updated by subtracting, from the baseline count, the value obtained by multiplying the unit temperature change ΔTEMP_STEP by the determined base offset when the determined slope has a negative value.

10. The grip sensing method according to claim 7, wherein the baseline count is not updated and temperature compensation is performed such that the temperature-compensated baseline count is equal to or greater than a lower-limit base value MINUS_LIMIT, when the measured temperature change amount is equal to or less than a second value.

11. The grip sensing method according to claim 4, wherein the updating of the baseline count includes:
    increasing the baseline count by a third value when the determined slope has a positive value; and
    decreasing the baseline count by the third value when the determined slope has a negative value.

12. The grip sensing method according to claim 1, wherein the event is any one of a grip detect event and a grip release event.

13. A grip sensing apparatus comprising:
    an amplifier configured to differentially amplify a voltage potential of a grip channel based on a predetermined correction offset;
    an analog-to-digital converter configured to perform digital conversion with respect to output of the amplifier to generate a sensing count;
    a comparator configured to compare the sensing count with a predetermined base value;
    a baseline tracking unit configured to determine a baseline count based on the sensing count when the sensing count is less than the base value as a result of comparison by the comparator;
    a temperature compensator configured to stop the baseline tracking and perform temperature compensation with respect to the baseline count using a temperature sensor mounted therein, when the sensing count is equal to or greater than the base value as a result of comparison by the comparator; and
    a sensing unit configured to sense an event based on the sensing count and the temperature-compensated baseline count.

14. The grip sensing apparatus according to claim 13, wherein the sensing unit includes:
    a unit configured to subtract the temperature-compensated baseline count from the sensing count;
    a unit configured to compare the subtracted value with a second base count value;
    a unit configured to determine a grip state when the subtracted value exceeds the second base count value as a result of comparison; and
    a unit configured to determine that the grip state is released when the subtracted value is equal to or less than the second base count value as the result of comparison.

15. The grip sensing apparatus according to claim 13, wherein the temperature compensator includes:
    a unit configured to measure a change amount of the sensing count during a first time;
    a unit configured to measure a temperature change amount during the first time when the change amount of the sensing count exceeds a first value CONT_T; and
    a unit configured to update the baseline count when the measured temperature change amount exceeds a second value TEMP_T.

16. The grip sensing apparatus according to claim 15, wherein the temperature compensator further includes a unit configured to determine a slope corresponding to the measured temperature change amount.

17. The grip sensing apparatus according to claim 16, wherein the temperature compensator:
    determines a temperature coefficient TEMP.COEF corresponding to a temperature change range by referring to a prestored look-up table, and updates the baseline count BASE_DATA based on the determined temperature coefficient and the determined slope, the temperature coefficient being nonlinear according to the temperature change,
    updates the baseline count by multiplying the baseline count by a unit temperature change ΔTEMP_STEP and the determined temperature coefficient, when the calculated slope has a positive value, and
    updates the baseline count by multiplying the baseline count by the unit temperature change ΔTEMP_STEP and then dividing the multiplied value by the determined temperature coefficient, when the calculated slope has a negative value.

18. The grip sensing apparatus according to claim 16, wherein the temperature compensator:
    determines a base offset BASE_OFFSET corresponding to a temperature change range by referring to the prestored look-up table and updates the baseline count based on the determined base offset and the determined slope,
    updates the baseline count by adding, to the baseline count, the value obtained by multiplying the unit temperature change ΔTEMP_STEP by the determined base offset, when the determined slope has a positive value, and
    updates the baseline count by subtracting, from the baseline count, the value obtained by multiplying the unit temperature change ΔTEMP_STEP by the determined base offset, when the determined slope has a negative value.

19. The grip sensing apparatus according to claim 16, wherein the temperature compensator increases the baseline count by a third value when the determined slope has a positive value and decreases the baseline count by the third value when the determined slope has a negative value, and
    wherein the third value is set to a fixed value regardless of a temperature change range.

20. The grip sensing apparatus according to claim 13, wherein the event is any one of a grip detect event and a grip release event, and wherein the temperature compensator performs temperature compensation such that the temperature-compensated baseline count is equal to or greater than a lower-limit base value MINUS_LIMIT.

* * * * *